United States Patent
Okada (10) Patent No.: US 8,509,575 B2
(45) Date of Patent: Aug. 13, 2013

(54) SEMICONDUCTOR OPTICAL MODULATION DEVICE

(75) Inventor: Norio Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/318,638

(22) PCT Filed: May 19, 2010

(86) PCT No.: PCT/JP2010/058454
§ 371 (c)(1),
(2), (4) Date: Nov. 3, 2011

(87) PCT Pub. No.: WO2010/140473
PCT Pub. Date: Dec. 9, 2010

(65) Prior Publication Data
US 2012/0045161 A1 Feb. 23, 2012

(30) Foreign Application Priority Data
Jun. 2, 2009 (JP) .................. 2009-133372

(51) Int. Cl.
*G02B 6/12* (2006.01)
(52) U.S. Cl.
USPC ................... 385/14; 385/1; 372/36
(58) Field of Classification Search
USPC ............... 385/14, 1; 372/36; 257/99
See application file for complete search history.

(56) References Cited

U.S. PATENT DOCUMENTS

| 4,338,577 | A | * | 7/1982 | Sato et al. ............ 372/36 |
| 6,807,207 | B2 | | 10/2004 | Shiomoto |
| 7,189,012 | B2 | | 3/2007 | Kuhara et al. |
| 7,263,112 | B2 | * | 8/2007 | Oomori et al. ......... 372/36 |
| 7,856,038 | B2 | | 12/2010 | Oomori |
| 7,936,495 | B2 | | 5/2011 | Okada et al. |
| 2003/0043868 | A1 | * | 3/2003 | Stewart et al. ......... 372/36 |
| 2005/0013561 | A1 | | 1/2005 | Kuhara et al. |
| 2005/0207459 | A1 | * | 9/2005 | Yu et al. ............... 372/36 |
| 2006/0008194 | A1 | | 1/2006 | Kagaya et al. |
| 2006/0176918 | A1 | | 8/2006 | Aruga |

FOREIGN PATENT DOCUMENTS

| CN | 1770576 A | 5/2006 |
| EP | 1 655 630 A2 | 5/2006 |
| EP | 1 655 630 B1 | 5/2012 |

(Continued)

OTHER PUBLICATIONS

International Search Report Issued Jun. 15, 2010 in PCT/JP10/058454 Filed May 19, 2010.

(Continued)

*Primary Examiner* — Ellen Kim
(74) *Attorney, Agent, or Firm* — Oblon, Spivak, McClelland, Maier & Neustadt, L.L.P.

(57) ABSTRACT

A temperature control module and a support block are mounted on a metal stem. A dielectric substrate is mounted on a side surface of the support block. A support block is mounted on a cooling surface of the temperature control module. A dielectric substrate is mounted on a side surface of the support block. A semiconductor optical modulation element is mounted on the dielectric substrate. A lead pin and a signal line are connected through a bonding wire. The signal line and a signal conductor are connected through a bonding wire. The signal conductor and the semiconductor optical modulation element are connected through a bonding wire.

11 Claims, 7 Drawing Sheets

(56) References Cited

FOREIGN PATENT DOCUMENTS

| | | |
|---|---|---|
| JP | 64-10685 A | 1/1989 |
| JP | 4-82287 A | 3/1992 |
| JP | 07-254746 | 10/1995 |
| JP | 2000 019473 | 1/2000 |
| JP | 2000-223791 | 8/2000 |
| JP | 2004 063852 | 2/2004 |
| JP | 2004-63852 A | 2/2004 |
| JP | 2004 356233 | 12/2004 |
| JP | 2005 086094 | 3/2005 |
| JP | 2006 128545 | 5/2006 |
| JP | 2007 266066 | 10/2007 |
| JP | 2008 085366 | 4/2008 |
| JP | 2008 153468 | 7/2008 |

OTHER PUBLICATIONS

Japanese Decision of a Patent Grant issued Dec. 25, 2012 in Patent Application No. 2011-518381 with English Translation.
Combined Chinese Office Action and Search Report issued Oct. 8, 2012, in Chinese Patent Application No. 201080024276.3.
Korean Office Action dated May 8, 2013 issued to Korean Patent Application No. 10-2011-7028844.

* cited by examiner

SEMICONDUCTOR OPTICAL MODULATION DEVICE

FIELD

The present invention relates to a semiconductor optical modulation device, and in particular, to a TO-CAN (Top Open Can) structure where a semiconductor optical modulation element to be temperature-controlled by a temperature control module is mounted.

BACKGROUND

In a TO-CAN structure where a semiconductor optical modulation element is mounted, a temperature control module may be mounted on a metal stem for the sake of temperature control on the semiconductor optical modulation element.

Patent Literature 1 discloses a technology in which backward light output from a laser diode is passed outside a first plate-like body and received by a photodiode that is supported by a second plate-like body, so that a photodiode is eliminated from the first plate-like body supporting the laser diode to reduce the power consumption of the thermoelectric module.

CITATION LIST

Patent Literature

Patent Literature 1: Japanese Patent Application Laid-open No. 2008-85366

SUMMARY

Technical Problem

According to the foregoing conventional technology, in order for the temperature control module to exercise temperature control on the semiconductor optical modulation element, the semiconductor optical modulation element needs to be arranged on the temperature control module which is mounted on the metal stem. To connect a lead pin penetrating through the metal stem to the semiconductor optical modulation element, it is therefore needed to either extend the lead pin to the extent corresponding to the thickness of the temperature control module or extend a bonding wire that connects the lead pin to the semiconductor optical modulation element. This consequently increases the inductance between the lead pin and the semiconductor optical modulation element. There have been problems of a higher loss and poor frequency response characteristics when transmitting signals of 10 Gbps and higher.

Furthermore, when an EAM-LD (Electroabsorption-Laser Diode) is used as the semiconductor optical modulation element, the signal line needs to be supplied with a stable reference potential. There is a problem in that the increased inductance makes in-band resonance more likely to occur, which degrades the frequency response characteristics.

The present invention is made in view of the foregoing, and an object of the invention is to provide a semiconductor optical modulation device that can suppress an increase in inductance and connect the lead pin penetrating through the metal stem to the semiconductor optical modulation element as well, even if the semiconductor optical modulation element is arranged on the temperature control module that is mounted on the metal stem.

Solution to Problem

A semiconductor optical modulation device according to an aspect of the present invention including: a metal stem; a lead pin that penetrates through the metal stem; a first support block that is mounted on the metal stem; a temperature control module that is mounted on the metal stem; a first dielectric substrate that is mounted on a side surface of the first support block; a second support block that is mounted on the temperature control module; a signal line that is formed on the first dielectric substrate; a second dielectric substrate that is mounted on a side surface of the second support block; a signal conductor that is formed on the second dielectric substrate; a semiconductor optical modulation element that is mounted on the second dielectric substrate; a first bonding wire that connects the lead pin to an end of the signal line; a second bonding wire that connects the other end of the signal line to an end of the signal conductor; and a third bonding wire that connects another end of the signal conductor to the semiconductor optical modulation element.

Advantageous Effects of Invention

This invention provides the effect that it is possible to suppress an increase in inductance and connect the lead pin penetrating through the metal stem to the semiconductor optical modulation element as well, even if the semiconductor optical modulation element is arranged on the temperature control module that is mounted on the metal stem.

BRIEF DESCRIPTION OF DRAWINGS

FIG. 5-1 is a perspective view showing a schematic configuration of a fourth embodiment of the semiconductor optical modulation device according to the present invention.

FIG. 5-2 is a side view showing a schematic configuration of an optical transmitter receiver on which the semiconductor optical modulation device of FIG. 5-1 is mounted.

DESCRIPTION OF EMBODIMENTS

Hereinafter, embodiments of the semiconductor optical modulation device according to the present invention will be described in detail with reference to the drawings. It should be noted that the present invention is not limited by these embodiments.

First Embodiment

Figure 1:
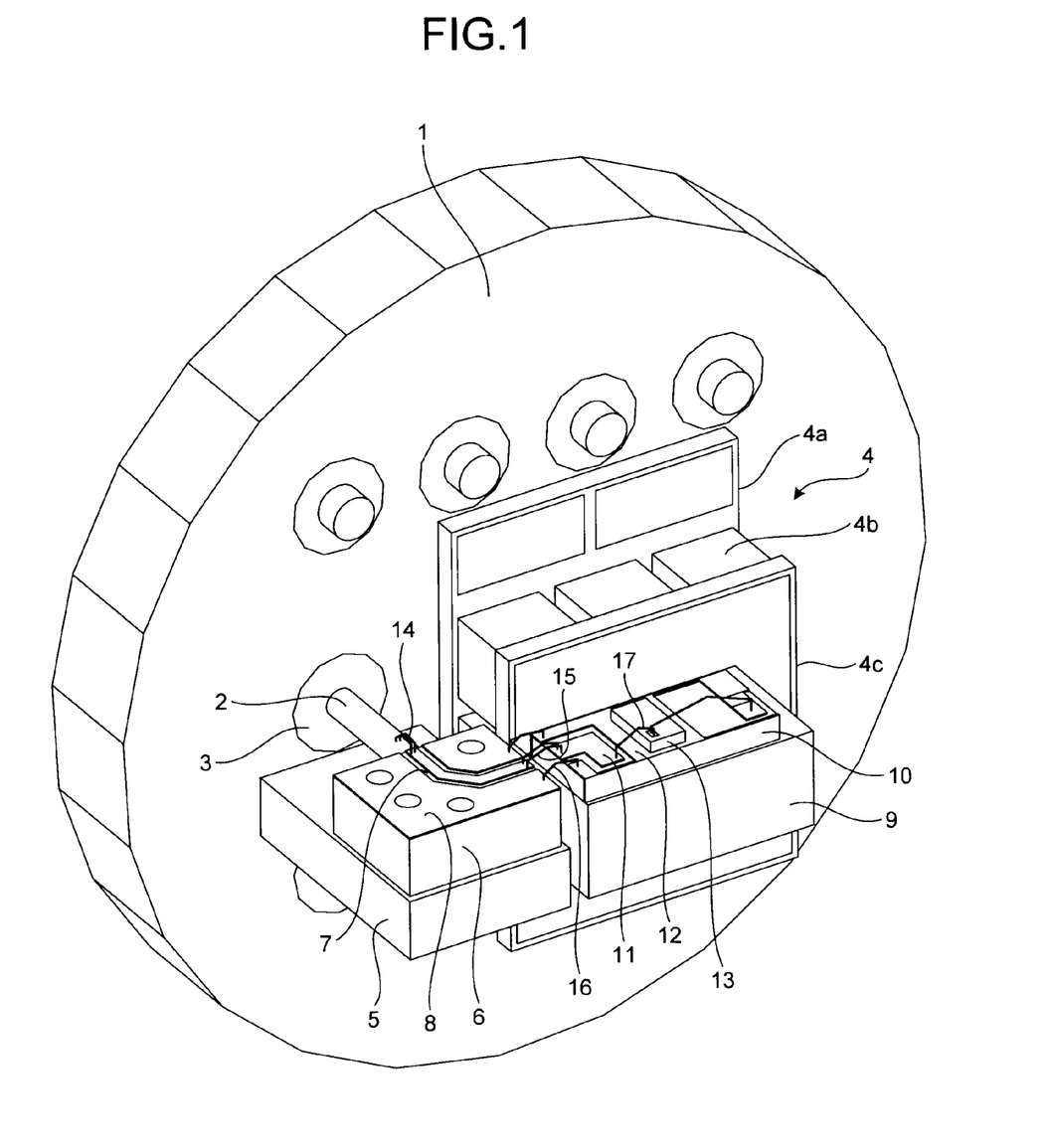
FIG. 1 is a perspective view showing a schematic configuration of a first embodiment of the semiconductor optical modulation device according to the present invention.

FIG. 1 is a perspective view showing a schematic configuration of a first embodiment of the semiconductor optical modulation device according to the present invention. In FIG. 1, a metal stem 1 is provided with a lead pin 2 which penetrates through the metal stem 1. The lead pin 2 is fixed to the metal stem 1 via a glass material 3. The metal stem 1 and the lead pin 2 may be made of a metal material such as copper, iron, aluminum, or stainless steel. The surfaces of the metal stem 1 and the lead pin 2 may be plated with gold, nickel, or the like.

A temperature control module 4 and a support block 5 are mounted on the metal stem 1. Here, the temperature control module 4 is provided with Peltier elements 4b. The Peltier elements 4b are interposed between a heat radiation surface 4a and a cooling surface 4c.

A dielectric substrate 6 is mounted on a side surface of the support block 5. A support block 9 is mounted on the cooling surface 4c of the temperature control module 4. A dielectric substrate 10 is mounted on a side surface of the support block 9. A semiconductor optical modulation element 13 is mounted on the dielectric substrate 10. Examples of the semiconductor optical modulation element 13 used include a modulator integrated laser (EAM-LD) in which an electroabsorption optical modulator having an InGaAsP-based quantum well absorption layer and a distributed-feedback laser diode are monolithically integrated, and an $LiNbO_3$ Mach-Zehnder optical modulator.

Here, a signal line 7 and a ground conductor 8 are formed on the dielectric substrate 6. The signal line 7 may be laid across mutually orthogonal sides of the dielectric substrate 6. The ground conductor 8 may be formed over the entire top surface of the dielectric substrate 6 with a constant distance to the signal line 7, thereby constituting a coplanar line. The ground conductor 8 may be electrically connected to the support block 5 via through holes formed in the dielectric substrate 6.

A signal conductor 11 and a ground conductor 12 are formed on the dielectric substrate 10. The ground conductor 12 may be formed on the dielectric substrate 10 with a predetermined distance to the signal conductor 11. The ground conductor 12 may also be formed on the side surfaces of the dielectric substrate 10.

The support blocks 5 and 9 may be made of a metal material such as copper, iron, aluminum, or stainless steel. Alternatively, the support blocks 5 and 9 may be configured such that an insulator such as ceramic or resin is covered with metal. The dielectric substrates 6 and 10 may be made of ceramic such as alumina, and may be made of epoxy or other resins.

It is preferred that the support block 5 be arranged near the lead pin 2. It is preferred that the support block 9 be arranged near the dielectric substrate 6.

The lead pin 2 and an end of the signal line 7 are connected to each other through bonding wires 14. The other end of the signal line 7 and an end of the signal conductor 11 are connected to each other through bonding wires 15. The ground conductors 8 and 12 are connected to each other through a bonding wire 16. Another end of the signal conductor 11 and a signal terminal of the semiconductor optical modulation element 13 are connected to each other through a bonding wire 17.

When an electrical signal is input to the lead pin 2, the electrical signal is transmitted to the signal line 7 through the bonding wires 14, then transmitted to the signal conductor 11 through the bonding wires 15, and further applied to the semiconductor optical modulation element 13 through the bonding wire 17. Here, the metal stem 1 functions as an AC ground since the electrical signal input to the lead pin 2 is electromagnetically coupled with the metal stem 1. As the metal stem 1 functions as an AC ground, the support block 5 in connection with the metal stem 1 also functions as an AC ground. As the ground conductor 8 is connected with the support block 5, the ground conductor 8 also functions as an AC ground. The ground conductor 8 is further connected to the ground conductor 12 through the bonding wire 16, and the ground conductor 12 is connected to the cooling surface 4c of the temperature control module 4 through the support block 9. This can make the cooling surface 4c and the metal stem 1 identical in potential. Consequently, even if the cooling surface 4c and the metal stem 1 are separated in terms of DC potential, it is possible to supply a stable reference potential to the cooling surface 4c. Even if an EAM-LD is used as the semiconductor optical modulation element, it is possible to make in-band resonance less likely to occur, and suppress degradation in frequency response characteristics.

Since the electrical signal input to the lead pin 2 is transmitted to the semiconductor optical modulation element 13 through the signal line 7, the lead pin 2 and the semiconductor optical modulation element 13 need not be directly connected through the bonding wires 14. Consequently, even if the temperature control module 4 is arranged under the semiconductor optical modulation element 13, the lead pin 2 or the bonding wires 14 need not be extended to the extent corresponding to the thickness of the semiconductor optical modulation element 13. This can suppress an increase in inductance between the lead pin 2 and the semiconductor optical modulation element 13. It is therefore possible to reduce a loss in the high frequency band even when transmitting signals of 10 Gbps and higher.

Figure 2:
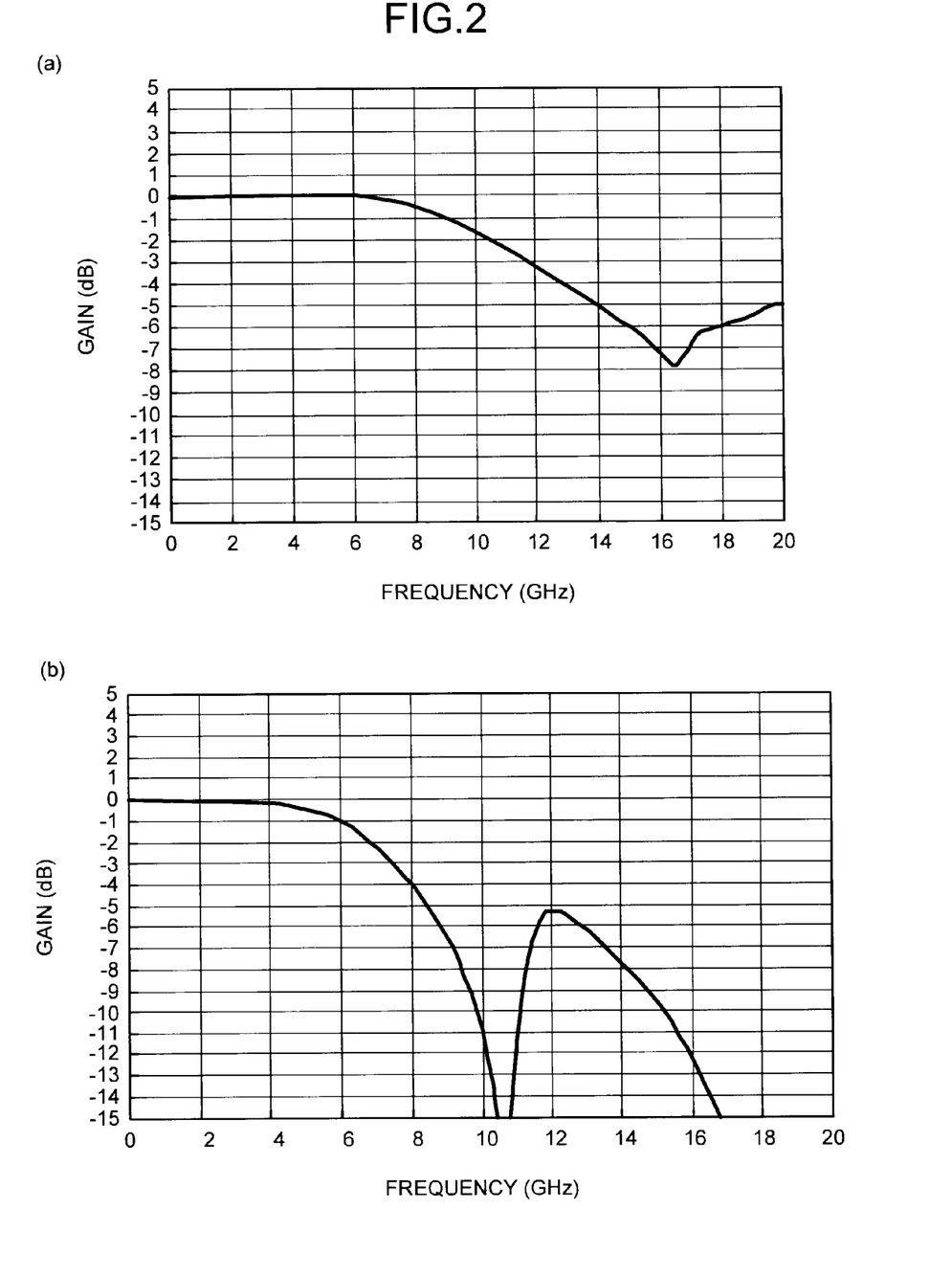
FIG. 2 is a diagram showing the frequency response characteristic of the semiconductor optical modulation device of FIG. 1 in comparison to a conventional example.

FIG. 2 is a diagram showing the frequency response characteristic of the semiconductor optical modulation device of FIG. 1 in comparison to a conventional example. FIG. 2(a) shows the result of three-dimensional electromagnetic field simulation of the frequency response characteristic, with a parasitic resistance and capacitance of the semiconductor optical modulation device of FIG. 1 added. FIG. 2(b) shows the result of three-dimensional electromagnetic field simulation of the frequency response characteristic of a semiconductor optical modulation device according to a conventional example where the lead pin 2 and the semiconductor optical modulation element 13 are directly connected through bonding wires.

In FIG. 2(a), the semiconductor optical modulation device of FIG. 1 yielded a 3-dB passband up to above 11 GHz. On the other hand, in the conventional example, resonance occurred in the vicinity of 10 GHz, with a 3-dB passband below 8 GHz.

Second Embodiment

Figure 3:
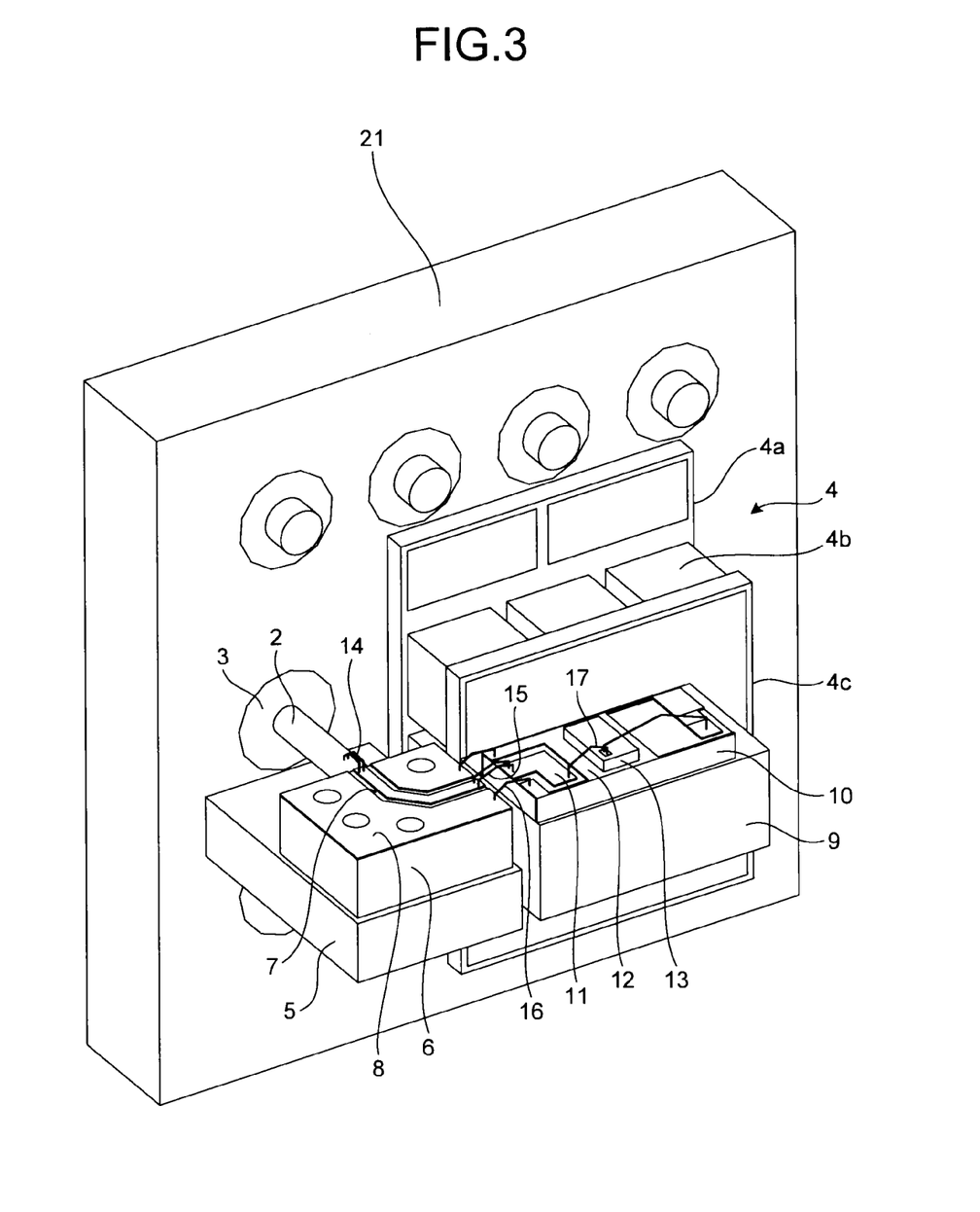
FIG. 3 is a perspective view showing a schematic configuration of a second embodiment of the semiconductor optical modulation device according to the present invention.

FIG. 3 is a perspective view showing a schematic configuration of a second embodiment of the semiconductor optical modulation device according to the present invention. In FIG. 3, the semiconductor optical modulation device includes a metal stem 21 instead of the metal stem 1 of FIG. 1. While the metal stem 1 of FIG. 1 has a circular shape, the metal stem 21 is configured in a rectangular shape. Forming a semiconductor optical modulation device on the metal stem 21 needs a total of six lead pins, which include a positive terminal pin of the temperature control module 4, a negative terminal pin of the temperature control module 4, a pin intended for a temperature sensing element, a pin intended for a monitor photodiode, a pin intended for a laser diode, and a signal pin.

The six lead pins are arranged along the periphery of the temperature control module 4. The support block 5 is arranged near the signal pin.

The rectangular configuration of the metal stem 21 can match the shape of the metal stem 21 with that of the temperature control module 4, and the six lead pins can be arranged at high density along the periphery of the temperature control module 4. This can reduce the unused area of the metal stem 21, allowing miniaturization of the semiconductor optical modulation device.

Third Embodiment

Figure 4:
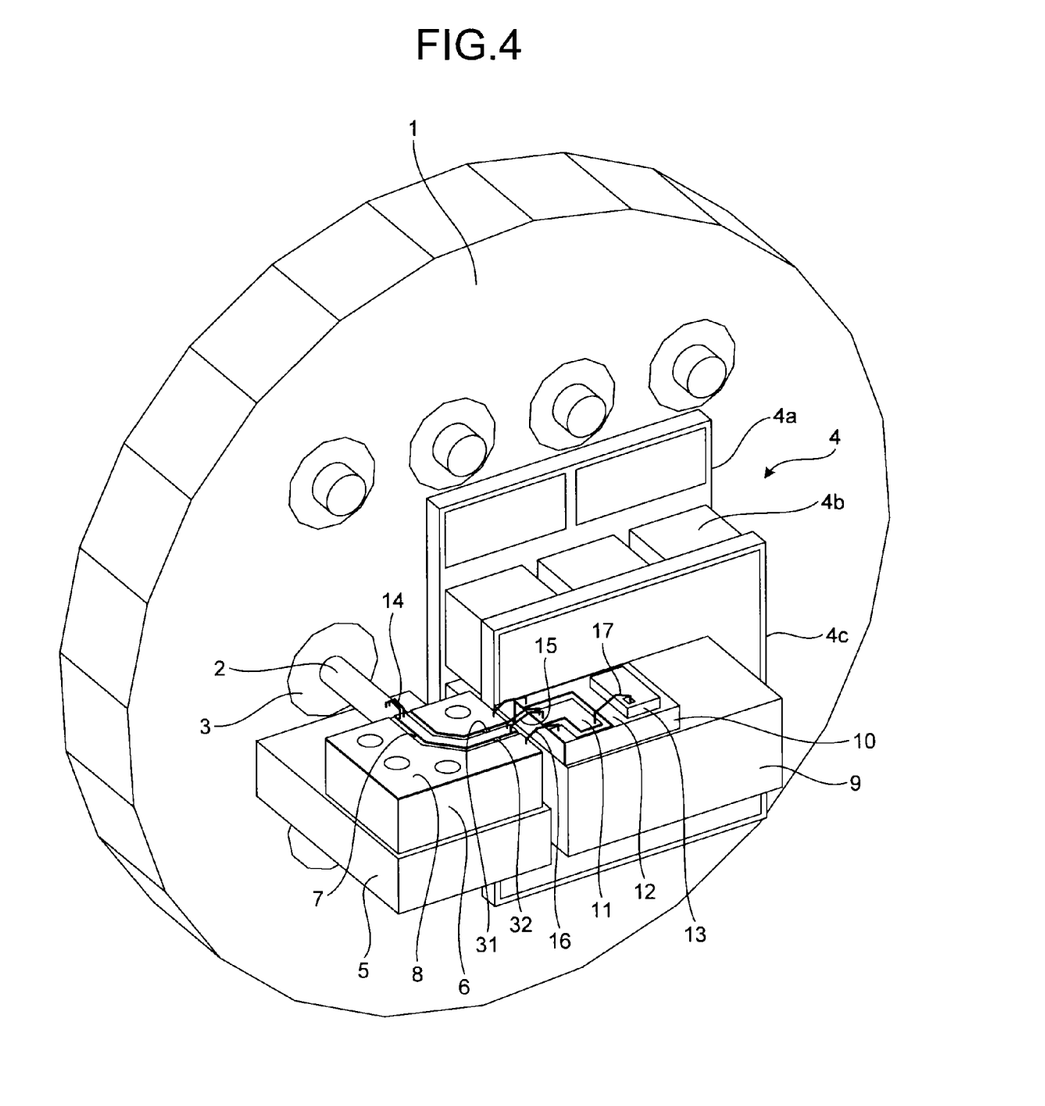
FIG. 4 is a perspective view showing a schematic configuration of a third embodiment of the semiconductor optical modulation device according to the present invention.

FIG. 4 is a perspective view showing a schematic configuration of a third embodiment of the semiconductor optical modulation device according to the present invention. In FIG. 4, the semiconductor optical modulation device includes resistors 31 and 32 in addition to the configuration of the semiconductor optical modulation device of FIG. 1. The resistors 31 and 32 are formed on the dielectric substrate 6, and can connect the signal line 7 and the ground conductor 8 to each other.

The provision of the resistors 31 and 32 for connecting the signal line 7 and the ground conductor 8 to each other on the dielectric substrate 6 allows impedance matching. In addition, since the heat generated by the resistors 31 and 32 need not be absorbed by the temperature control module 4, it is possible to reduce the power consumption of the temperature control module 4.

For example, when the resistors 31 and 32 have a resistance of 50Ω, the drive method is DC-coupled drive, the drive amplitude is 2.0 Vpp, and the offset voltage (high-level voltage) is −0.6 V, then the resistors 31 and 32 generate 0.0912 W of heat.

While the third embodiment of FIG. 4 has dealt with the method of using the metal stem 1 having a circular outer shape, the metal stem 21 having a rectangular outer shape may be used as shown in FIG. 3.

Fourth Embodiment

Figure 51:
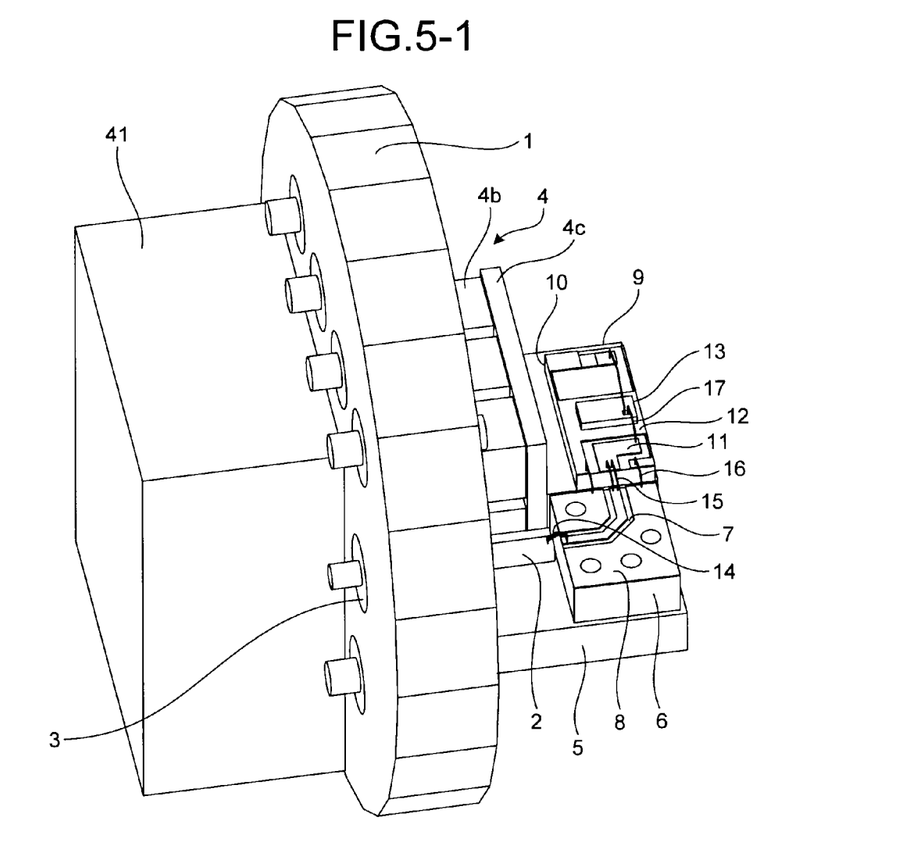

FIG. 5-1 is a perspective view showing a schematic configuration of a fourth embodiment of the semiconductor optical modulation device according to the present invention. In FIG. 5-1, the semiconductor optical modulation device includes a heat radiation block 41, which is arranged on the back side of the metal stem 1, in addition to the configuration of the semiconductor optical modulation device of FIG. 1. It is preferred that the material of the heat radiation block 41 have a thermal conductivity equivalent to or higher than that of the metal stem 1. For example, metal such as copper may be used. It is preferred that the heat radiation block 41 be arranged so as to avoid the lead pin 2 which protrudes from the back side of the metal stem 1. It is also preferred that an end of the heat radiation block 41 be aligned with one of the metal stem 1.

Figure 52:
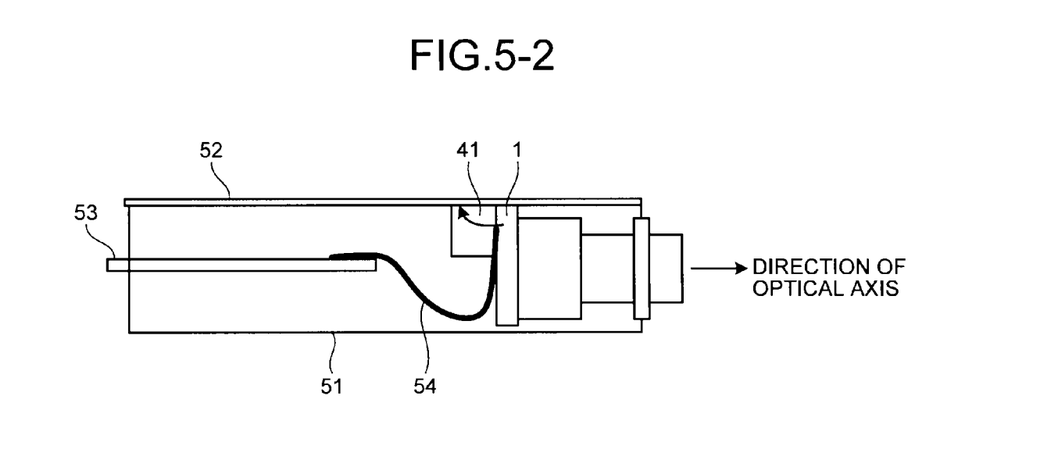

FIG. 5-2 is a side view showing a schematic configuration of an optical transmitter receiver on which the semiconductor optical modulation device of FIG. 5-1 is mounted. In FIG. 5-2, the optical transmitter receiver 51 has a heat radiation surface 52 which is arranged in parallel with the direction of the optical axis. The semiconductor optical modulation device of FIG. 5-1 is mounted on the optical transmitter receiver 51 so that the heat radiation block 41 and the metal stem 1 are in contact with the heat radiation surface 52. The lead pin 2 is connected to a circuit substrate 53 through a lead line 54.

The provision of the heat radiation block 41 on the back side of the metal stem 1 can form a heat radiation path extending from the heat radiation block 41 to the heat radiation surface 52. This allows efficient dissipation of heat occurring from the temperature control module 4 to outside the semiconductor optical modulation device.

While the fourth embodiment of FIG. 5-1 has dealt with the method of using the metal stem 1 having a circular outer shape, the metal stem 21 having a rectangular outer shape may be used as shown in FIG. 3. As shown in FIG. 4, the resistors 31 and 32 for connecting the signal line 7 and the ground conductor 8 to each other may be formed on the dielectric substrate 6.

Fifth Embodiment

Figure 6:
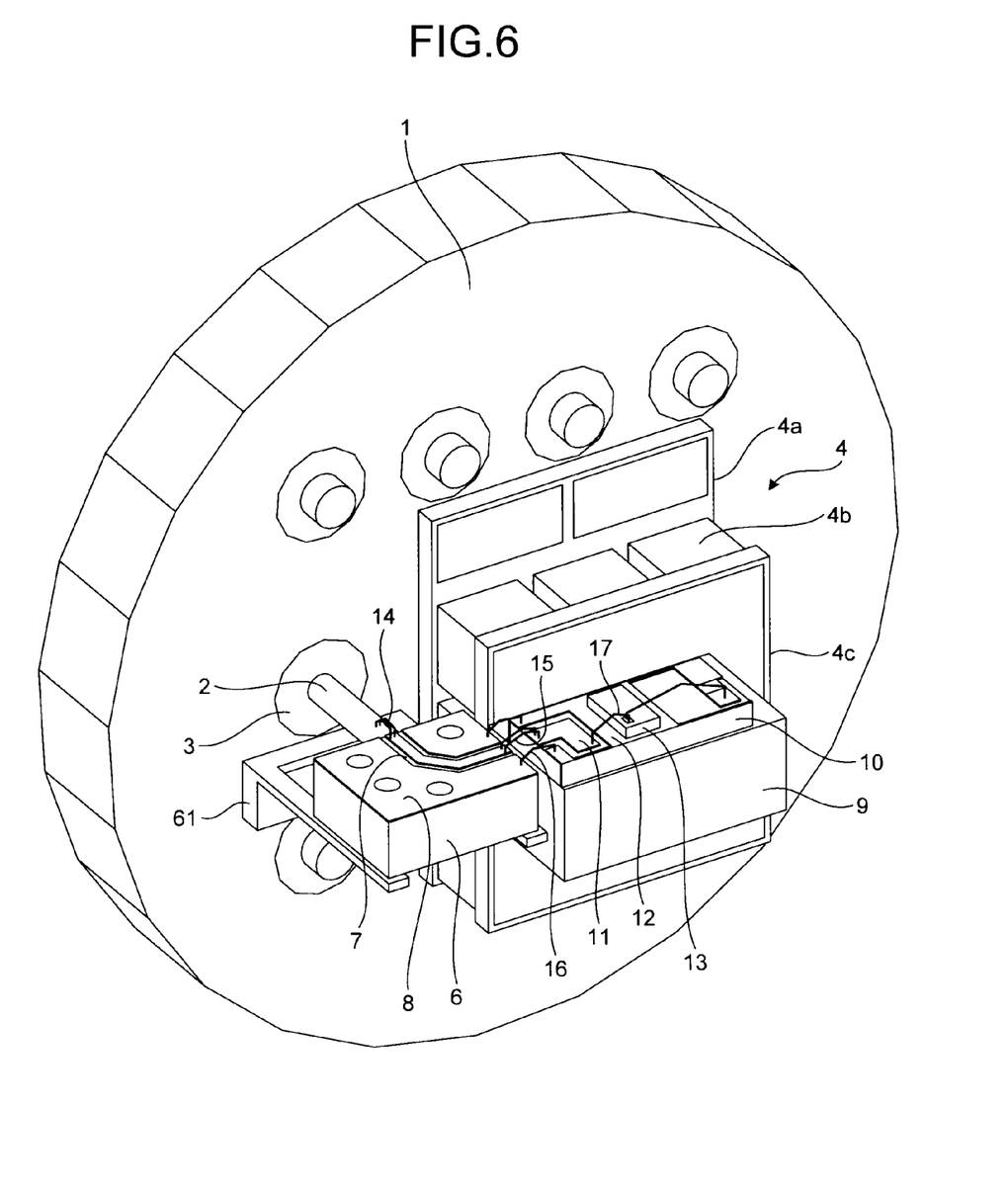
FIG. 6 is a perspective view showing a schematic configuration of a fifth embodiment of the semiconductor optical modulation device according to the present invention.

FIG. 6 is a perspective view showing a schematic configuration of a fifth embodiment of the semiconductor optical modulation device according to the present invention. In FIG. 6, the semiconductor optical modulation device includes a support body 61 instead of the support block 5 of FIG. 1. The support body 61 can support both ends of the dielectric substrate 6 on the metal stem 1. It is preferred that the support surface of the support body 61 have a thickness as small as possible within the range of withstanding the weight of the dielectric substrate 6. For example, the support body 61 may have an L-shape at the sides. The support surface of the support body 61 may be U-shaped.

The member 61 may be made of a metal material such as copper, iron, aluminum, or stainless steel. Alternatively, the support body 61 may be configured such that an insulator such as ceramic or resin is covered with metal.

Supporting both ends of the dielectric substrate 6 with the support body 61 can reduce the contact area between the dielectric substrate 6 and the support body 61. The support surface of the support body 61 can be reduced in thickness to narrow the heat transfer path between the dielectric substrate 6 and the metal stem 1. This can increase the thermal resistance between the dielectric substrate 6 and the metal stem 1, thereby reducing heat that flows into the temperature control module 4 through the path of the metal stem 1→the support body 61→the dielectric substrate 6→the bonding wires 15 and 16→the dielectric substrate 10→the support block 9→the temperature control module 4. It is therefore possible to reduce the power consumption of the temperature control module 4.

Suppose, for example, in the first embodiment of FIG. 1, the support block 5 is made of SPC (1.5 mm×2.0 mm×0.5 mm), the dielectric substrate 6 is made of alumina (1.5 mm×1.5 mm×0.38 mm), and there are five 25-um-φ gold wires of 300 um in length as the bonding wires 14 to 17. Given a temperature difference of 50° C. between the cooling surface 4c and the heat radiation surface 4a, 0.115 W of heat enters the cooling surface 4c.

If, in the fifth embodiment of FIG. 6, the support body 61 is made of SPC (0.8 mm×2.0 mm×0.1 mm) and the other conditions are unchanged, the amount of heat to enter the cooling surface 4c is reduced to 0.062 W.

Here, the gold wires are assumed to have a thermal conductivity of 317 W/mK, SPC is assumed to have a thermal conductivity of 60 W/mK, and alumina is assumed to have a thermal conductivity of 30 W/mK.

While the fifth embodiment of FIG. 6 has dealt with the method of using the metal stem 1 having a circular outer shape, the metal stem 21 having a rectangular outer shape may be used as shown in FIG. 3. As shown in FIG. 4, the resistors 31 and 32 for connecting the signal line 7 and the ground conductor 8 to each other may be formed on the dielectric substrate 6. As shown in FIG. 5-1, the heat radiation block 41 may be arranged on the back side of the metal stem 1.

Sixth Embodiment

Figure 7:
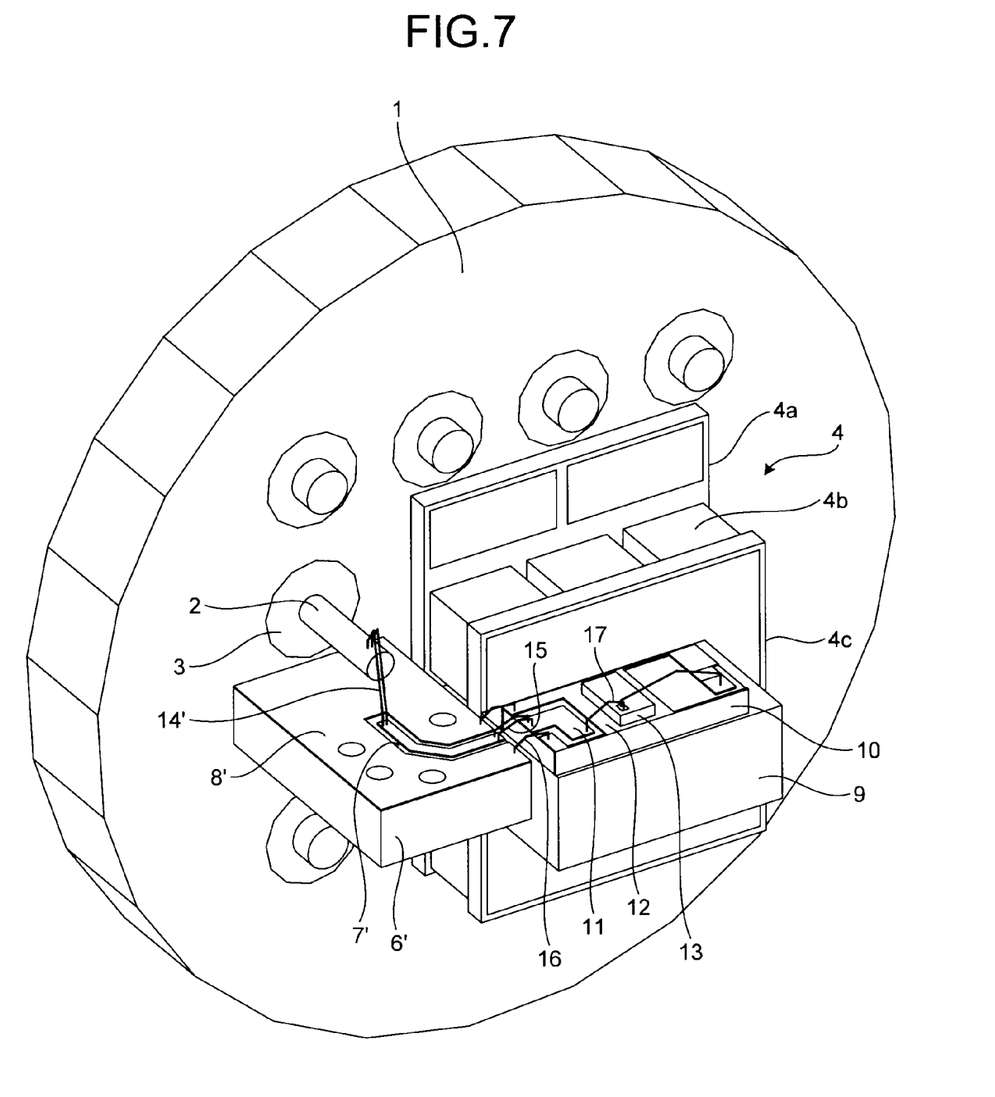
FIG. 7 is a perspective view showing a schematic configuration of a sixth embodiment of the semiconductor optical modulation device according to the present invention.

FIG. 7 is a perspective view showing a schematic configuration of a sixth embodiment of the semiconductor optical modulation device according to the present invention. In FIG. 7, the semiconductor optical modulation device includes a dielectric substrate 6' instead of the support block 5 and the dielectric substrate 6 of FIG. 1. Here, a signal line 7' and a ground conductor 8' are formed on the dielectric substrate 6'.

The signal line 7' may be laid from inside the dielectric substrate 6' to a side of the dielectric substrate 6'. The ground conductor 8' may be formed over the entire top surface of the dielectric substrate 6' with a constant distance to the signal line 7', thereby constituting a coplanar line.

The dielectric substrate 6' is arranged on the metal stem 1 via a side surface of the dielectric substrate 6'. The lead pin 2 and an end of the signal line 7' are connected to each other through bonding wires 14'.

Since the dielectric substrate 6' is arranged on the metal stem 1 via a side surface of the dielectric substrate 6', there is no need to use the support block 5 for supporting the dielectric substrate 6' on the metal stem 1. This makes it possible to reduce the parts count and suppress an increase in inductance between the lead pin 2 and the semiconductor optical modulation element 13.

While a seventh embodiment of FIG. 6 has dealt with the method of using the metal stem 1 having a circular outer shape, the metal stem 21 having a rectangular outer shape may be used as shown in FIG. 3. As shown in FIG. 4, the resistors 31 and 32 for connecting the signal line 7 and the ground conductor 8 to each other may be formed on the dielectric substrate 6'. As shown in FIG. 5-1, the heat radiation block 41 may be arranged on the back side of the metal stem 1.

Industrial Applicability

As has been described above, the semiconductor optical modulation device according to the present invention makes it possible to suppress an increase in inductance and connect the lead pin penetrating through the metal stem to the semiconductor optical modulation element as well, even if the semiconductor optical modulation element is arranged on the temperature control module that is mounted on the metal stem. The semiconductor optical modulation device according to the present invention is thus suited to a method of improving frequency response characteristics in a high frequency band.

Reference Signs List 1, 21 METAL STEM
2 LEAD PIN
3 GLASS MATERIAL
4 TEMPERATURE CONTROL MODULE
4a, 52 HEAT RADIATION SURFACE
4b PELTIER ELEMENT
4c COOLING SURFACE
5, 9 SUPPORT BLOCK
6, 6', 10 DIELECTRIC SUBSTRATE
7, 7' SIGNAL LINE
11 SIGNAL CONDUCTOR
8, 8', 12 GROUND CONDUCTOR
13 SEMICONDUCTOR OPTICAL MODULATION ELEMENT
14 to 17, 14' BONDING WIRE
31, 32 RESISTOR
41 HEAT RADIATION BLOCK
51 OPTICAL TRANSMITTER RECEIVER
53 CIRCUIT SURFACE
54 LEAD LINE
61 SUPPORT BODY

The invention claimed is:

1. A semiconductor optical modulation device comprising:
a metal stem;
a lead pin that penetrates through the metal stem;
a first support block that is mounted on the metal stem;
a temperature control module that is mounted on the metal stem;
a first dielectric substrate that is mounted on a side surface of the first support block;
a second support block that is mounted on the temperature control module;
a signal line that is formed on the first dielectric substrate;
a second dielectric substrate that is mounted on a side surface of the second support block;
a signal conductor that is formed on the second dielectric substrate;
a semiconductor optical modulation element that is mounted on the second dielectric substrate;
a first bonding wire that connects the lead pin to an end of the signal line;
a second bonding wire that connects the other end of the signal line to an end of the signal conductor; and
a third bonding wire that connects another end of the signal conductor to the semiconductor optical modulation element.

2. The semiconductor optical modulation device according to claim 1, wherein the first support block supports both ends of the first dielectric substrate.

3. The semiconductor optical modulation device according to claim 1, further comprising a ground conductor that is formed on the first dielectric substrate with a constant distance to the signal line.

4. The semiconductor optical modulation device according to claim 3, further comprising a resistor that is formed on the first dielectric substrate and connects the signal line to the ground line.

5. The semiconductor optical modulation device according to claim 1, wherein the metal stem has a rectangular shape.

6. The semiconductor optical modulation device according to claim 1, further comprising a heat radiation block that is attached to a back side of the metal stem.

7. A semiconductor optical modulation device comprising:
a metal stem;
a lead pin that penetrates through the metal stem;
a first dielectric substrate that is mounted on the metal stem via a side surface thereof;
a temperature control module that is mounted on the metal stem;
a support block that is mounted on the temperature control module;
a signal line that is formed on the first dielectric substrate;
a second dielectric substrate that is mounted on a side surface of the support block;
a signal conductor that is formed on the second dielectric substrate;
a semiconductor optical modulation element that is mounted on the second dielectric substrate;
a first bonding wire that connects the lead pin to an end of the signal line;
a second bonding wire that connects the other end of the signal line to an end of the signal conductor; and
a third bonding wire that connects another end of the signal conductor to the semiconductor optical modulation element.

8. The semiconductor optical modulation device according to claim 7, further comprising a ground conductor that is formed on the first dielectric substrate with a constant distance to the signal line.

9. The semiconductor optical modulation device according to claim 8, further comprising a resistor that is formed on the first dielectric substrate and connects the signal line to the ground line.

10. The semiconductor optical modulation device according to claim 7, wherein the metal stem has a rectangular shape.

11. The semiconductor optical modulation device according to claim 7, further comprising a heat radiation block that is attached to a back side of the metal stem.

* * * * *